United States Patent [19]

Grivna

[11] Patent Number: 5,139,608
[45] Date of Patent: Aug. 18, 1992

[54] METHOD OF PLANARIZING A SEMICONDUCTOR DEVICE SURFACE

[75] Inventor: Gordon M. Grivna, Mesa, Ariz.

[73] Assignee: Motorola, Inc., Schaumburg, Ill.

[21] Appl. No.: 678,376

[22] Filed: Apr. 1, 1991

[51] Int. Cl.⁵ .................. B44C 1/22; B29C 37/00; C03C 15/00; C03C 25/06
[52] U.S. Cl. .................... 156/643; 156/657; 156/659.1; 156/646
[58] Field of Search ............. 156/643, 646, 651, 653, 156/655, 657, 659.1, 668; 252/79.1; 204/192.32, 192.36, 192.37; 437/228, 235, 238

[56] References Cited

U.S. PATENT DOCUMENTS

| | | | |
|---|---|---|---|
| 4,511,430 | 4/1985 | Chen et al. | 156/657 X |
| 4,515,652 | 5/1985 | Gimpelson et al. | 156/643 |
| 4,523,975 | 6/1985 | Groves et al. | 156/643 |
| 4,605,470 | 8/1986 | Gwozdz et al. | 156/657 X |
| 4,662,064 | 5/1987 | Hsu et al. | 156/643 X |
| 4,676,868 | 6/1987 | Riley et al. | 156/643 |
| 4,816,112 | 3/1989 | Brooks et al. | 156/657 X |
| 4,952,274 | 8/1990 | Abraham | 156/643 |

Primary Examiner—William A. Powell
Attorney, Agent, or Firm—Joe E. Barbee

[57] ABSTRACT

A method of planarizing an irregular surface (16) of a semiconductor device uses a mask (17) that is a reverse image of the surface (16). The mask (17) and the surface (16) are isotropically etched at substantially equal rates thereby eroding the mask (17) away from the surface (16) to increase the portion of the surface (16) that is being etched. The controlled eroding of the mask (17) gradually increases the amount of semiconductor material exposed to the etching as the etching is performed thereby substantially planarizing the surface (16).

12 Claims, 2 Drawing Sheets

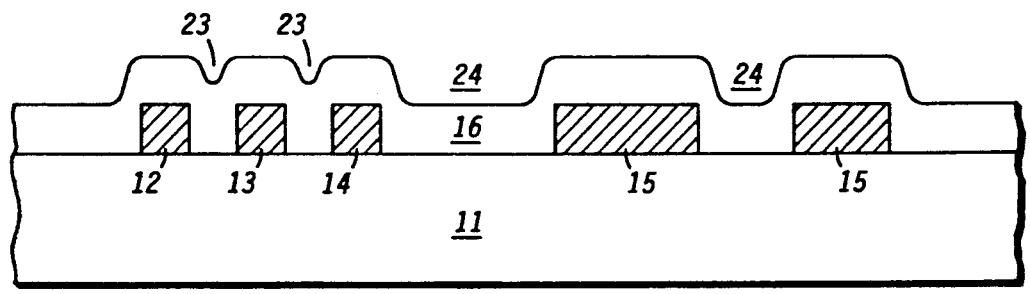
FIG. 1
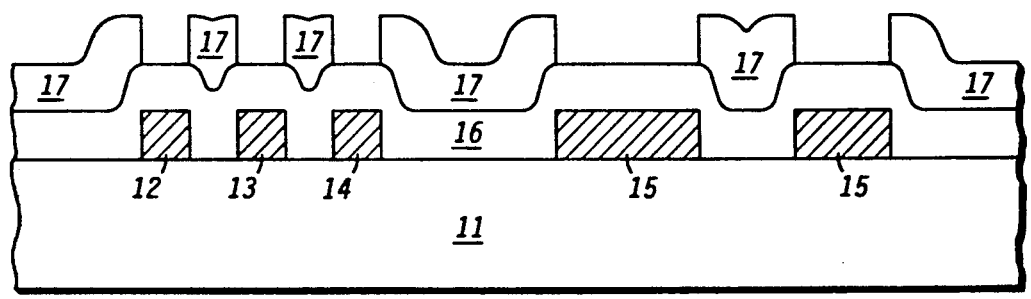
FIG. 2
FIG. 3
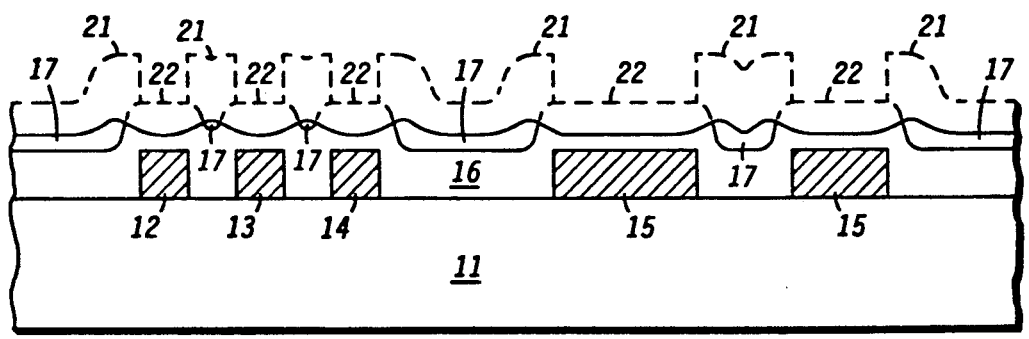

METHOD OF PLANARIZING A SEMICONDUCTOR DEVICE SURFACE

BACKGROUND OF THE INVENTION

The present invention relates, in general, to semiconductor devices, and more particularly, to a novel method of planarizing the surface of a semiconductor device.

As semiconductor active geometries shrink to submicron levels, there is an increased need for tightly spaced high density metallization to interconnect all the elements that can be implemented on a submicron semiconductor device. One parameter limiting the density and spacing of conductors on a semiconductor device is planarity of the surface on which the conductors are constructed. Previous methods of planarizing inner layer dielectrics generally could not provide surface excursions of less than 2000 angstroms (Å) which was required for the tightly spaced conductors. Both wet and dry (plasma) etching of the dielectric portions that were covering tightly spaced conductors were limited by gaps or spaces between the dielectric features to be planarized. If the gaps were too small, the portion of the mask that was covering the gap would lift-off during the planarization etch procedures. Mask lift-off resulted in inadvertent etching of areas that were to be protected by the mask. Often, the portion of the mask that lifted-off settled on another area of the dielectric and blocked etching of that area.

Wet etching of dielectrics that were covering narrow conductors was also limited by the inability of the wet etch to penetrate the gaps and for the etch byproducts to diffuse away from the gaps.

Accordingly, it is desirable to have a method of planarizing semiconductor device surfaces that provides a surface with excursions of less than 2000 Å, that does not lift-off the mask during the etching process, and that properly etches small areas between closely spaced features.

SUMMARY OF THE INVENTION

Briefly stated, the present invention provides a method of planarizing an irregular surface of a semiconductor device by applying a mask that is a reverse image of the surface. The mask and the surface are isotropically etched at substantially equal rates thereby eroding the mask away from the surface to increase the portion of the surface that is being etched. The controlled eroding of the mask gradually increases the amount of semiconductor material exposed to the etching as the etching is performed thereby substantially planarizing the surface.

BRIEF DESCRIPTION OF THE DRAWINGS

FIG. 1 is an enlarged cross section of a portion of a semiconductor device that has an irregular surface;

FIG. 2 is the semiconductor device of FIG. 1 after a mask has been applied to the surface in accordance with the present invention;

FIG. 3 is the semiconductor device of FIG. 2 at a stage in the planarization of the surface in accordance with the present invention;

DETAILED DESCRIPTION OF THE DRAWINGS

Figure 4:
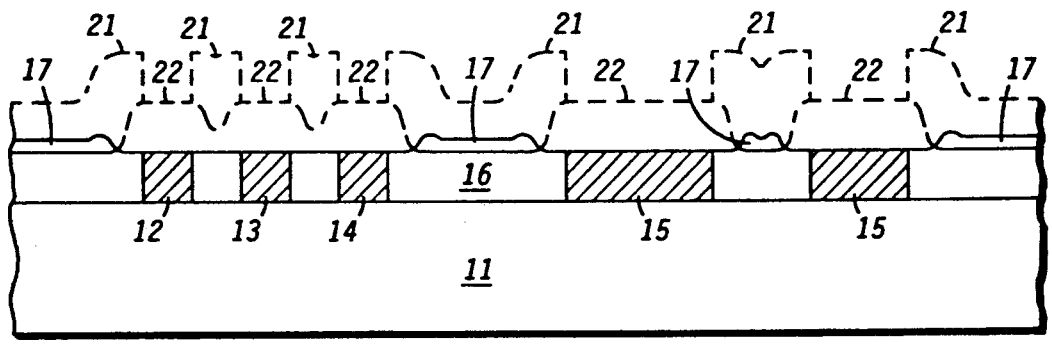
FIG. 4 is the semiconductor device of FIG. 3 at a subsequent stage in the planarization of the surface in accordance with the present invention.

The present invention provides a method of planarizing an irregular surface of a semiconductor device. While the invention is described with specific preferred embodiments, it is evident that many alternatives and variations will be apparent to those skilled in the semiconductor art. More specifically the invention has been described for a particular dielectric that is covering a particular conductor pattern, although the method is directly applicable to other dielectrics, as well as to other semiconductor surfaces, and other semiconductor materials.

FIG. 1 illustrates a portion of a semiconductor wafer 11 that has a conductor 12, a conductor 13, conductor 14, and conductors 15 on the surface of wafer 11. A dielectric 16 covers the surface of wafer 11 and conductors 12, 13, 14, and 15.

Dielectric 16 has an irregular surface with numerous excursions and depressions that must be removed in order to form a planar surface that can be utilized for depositing another layer of conductors. Typically, the surface of wafer 11 has conductors that are spaced very closely together, such as conductors 12, 13, and 14, in addition to conductors that have wide spacings, such as conductors 15. In the preferred embodiment, conductors 12, 13, and 14 have a center to center spacing of approximately one micron. Above tightly spaced conductors 12, 13, and 14, the thickness of dielectric 16 is increased by the thickness of conductors 12, 13, and 14 while small depressions 23 are created between conductors 12, 13, and 14. Widely spaced conductors 15 create large depressions 24 in the surface of dielectric 16. The widely varying surface of dielectric 16 results in a structure that is very difficult to planarize.

Referring to FIG. 2, a mask 17 that has a reverse image of the conductors on the surface of dielectric 16 is applied to dielectric 16. Reverse image or reverse density mask 17 fills small depressions 23 (FIG. 1) and large depressions 24 (FIG. 1) in dielectric 16. Mask 17 and the exposed portions of dielectric 16 are then isotropically etched at approximately equal rates with a plasma etch that etches or erodes mask 17 while etching dielectric 16. In the preferred embodiment, a downstream plasma etch with activated fluorine ions and activated oxygen ions is used to obtain the isotropic etching of both mask 17 and dielectric 16. In this embodiment, dielectric 16 is silicon dioxide that is etched by the fluorine ions while the oxygen ions etch mask 17. Also in this embodiment, mask 17 is any of several well-known photo resists that is formed using techniques that are well known in the semiconductor arts. As etching of the exposed surface of dielectric 16 proceeds, mask 17 is also eroded thereby exposing additional portions of dielectric 16 which are then etched along with the other surfaces of dielectric 16. Etching begins with the exposed portions of dielectric 16. As mask 17 is slowly eroded, the sidewalls of depressions 23 and 24 slowly become exposed to the etching. Therefore, eroding mask 17 during etching facilitates planarizing the surface of dielectric 16.

FIG. 3 and FIG. 4 depict various stages during the etching of dielectric 16 and mask 17. Wafer 11 and conductors 12, 13, 14, and 15 are the same as those of FIG. 2. Dielectric 16 and mask 17 are also the same as in FIG. 2 although the surface contour of dielectric 16 and mask 17 changes in FIG. 3 and FIG. 4 as the etching proceeds. A dashed line 21 represents the original position of mask 17 before etching was initiated while a dashed line 22 represents the original surface of dielectric 16.

Referring to FIG. 3, the original exposed surface of dielectric 16, dashed line 22, has been etched until only a small portion of mask 17 remains in the space between conductors 12, 13, and 14. As these final sections of mask 17 are eroded, the surface of dielectric 16 near conductors 12, 13, and 14 becomes increasingly planar. Therefore, eroding mask 17 while etching dielectric 16 facilitates etching different elevations of dielectric 16 for different lengths of time.

FIG. 4 illustrates a further stage in the etching of dielectric 16 and mask 17. Etching of dielectric 16 and mask 17 has progressed until only a small portion of mask 17 remains. Comparing the position of the remaining portion of mask 17 to the original starting position, dashed lines 21, illustrates how the isotropic etching eroded mask 17 away from the original exposed sections of dielectric 16 and reduced the thickness of mask 17 along with the thickness of the exposed portions of dielectric 16 thereby substantially planarizing the surface of dielectric 16. By slowly reducing the thickness of mask 17 while pulling mask 17 back away from the areas being etched, any remaining portions of mask 17 remain firmly attached to dielectric 16 thereby preventing mask 17 from lifting-off the surface of dielectric 16. Planarization of such closely spaced features without mask lift-off was not possible with previous wet etch or dry (plasma) etch methods.

Figure 5:
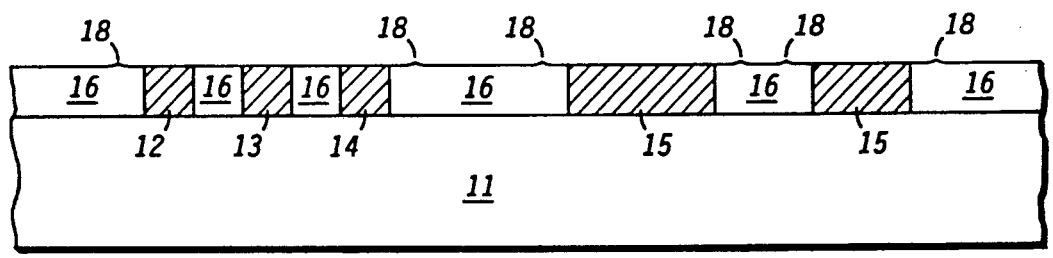
FIG. 5 is the semiconductor device of FIG. 4 after the etching is complete and the mask has been removed in accordance with the present invention.

Referring to FIG. 5, when the thickness of dielectric 16 has been reduced by an amount approximately equal to the thickness of conductors 12, 13, 14, and 15, etching is halted and remaining portions of mask 17 are removed. The resulting planarity of dielectric 16 depends on the thickness of dielectric 16 relative to the thickness of conductors 12, 13, 14, and 15 in addition to the thickness of mask 17 relative to dielectric 16, the alignment between mask 17 and dielectric 16, and the etch time. Since the elevations in the surface of dielectric 16 have a thickness approximately equal to the thickness of conductors 12, 13, 14, and 15, planarizing dielectric 16 requires reducing the elevations by that amount. Therefore, the thickness of dielectric 16 should be at least equal to the thickness of conductors 12, 13, 14, and 15. Since mask 17 is eroded at the same rate as dielectric 16, mask 17 should have a thickness that is at least equal to the thickness of conductors 12, 13, 14, and 15. Depending on the alignment between mask 17 and dielectric 16 and the various other factors mentioned above, small perturbations or bumps 18 may still remain on the surface of dielectric 16. The perturbations may appears as bumps 18 and/or small depressions next to bumps 18. The perturbations typically have a height between approximately 500 and 1,000 angstroms which is significantly less than the 2,000 angstroms required for planarization.

Figure 6:
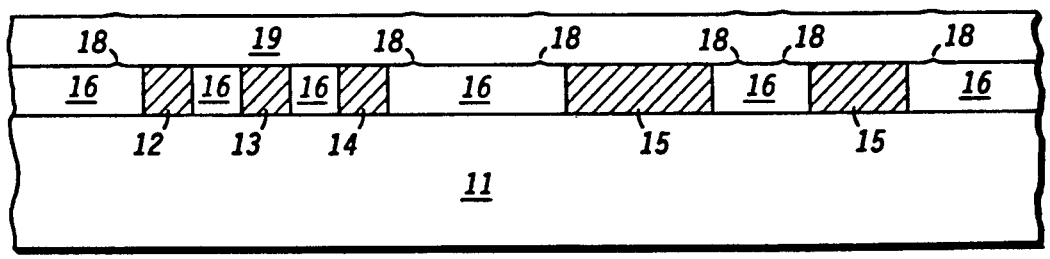
FIG. 6 is a semiconductor device with a substantially planar surface in accordance with the present invention.

Referring to FIG. 6, a protective layer 19 is applied on the surface of dielectric 16. Protective layer 19 is a dielectric that covers bumps 18 to smooth the effects of bumps 18 and results in perturbations of less than approximately 500 angstroms in the surface of protective layer 19. The substantially planarized surface of protective layer 19 can be utilized for forming other conductor layers or other elements of a semiconductor device.

By now it should be appreciated that there has been provided a novel way to planarize the surface of a semiconductor device. The unique method of eroding a mask during the etching of a semiconductor device surface facilitates etching different elevations of the surface for different lengths of time. Eroding the mask is contrary to previous etching methods which attempt to maintain the integrity of a photo mask in order to protect a surface from being etched. The erodible mask technique is applicable to inner layer dielectrics in addition to other semiconductor device surfaces. By using an erodible mask, a dielectric that is covering closely spaced metal lines can be planarized to a degree that was substantially impossible to accomplish with previous wet chemical or dry (plasma) etching techniques. The erodible mask technique eliminates mask lift-off problems associated with other planarization techniques, and eliminates reflowing of a planarized surface that is required by some planarization techniques.

I claim:

1. A method of planarizing a dielectric layer of a semiconductor device comprising:

providing a dielectric layer covering a plurality of closely spaced metal lines on a semiconductor device;

applying a mask having a pattern that is a reverse density image of the closely spaced metal lines wherein the mask exposes a first portion of the dielectric layer;

isotropically etching the mask and the first portion of the dielectric layer at rates that are approximately equal for a predetermined time to substantially planarize the dielectric layer by eroding sidewalls of the mask for exposing additional portions of the dielectric layer to the etching; and removing any remaining portions of the mask.

2. The method of claim 1 further including depositing a protective layer covering the substantially planarized dielectric layer.

3. The method of claim 1 wherein providing the dielectric layer covering the plurality of closely spaced metal lines includes providing a dielectric layer covering the plurality of metal lines that are separated by a distance of approximately one micron.

4. The method of claim 1 wherein providing the dielectric layer includes providing a silicon dioxide layer.

5. The method of claim 1 wherein isotropically etching includes etching with an isotropic plasma etch by using a downstream plasma etching technique that etches with fluorine ions and oxygen ions.

6. The method of claim 1 wherein the applying the mask step includes applying the mask having a thickness that is at least equal to a thickness of the metal lines, and wherein providing a dielectric provides a dielectric having a thickness that is approximately equal to the thickness of the metal lines.

7. A method of reducing irregularities in a dielectric layer of a semiconductor device comprising:

providing a semiconductor device having a pattern of elevations and depressions in a surface of a dielectric;

applying an erodible mask having a reverse image of the pattern onto the dielectric thereby exposing a first portion of the dielectric;

isotropically etching the mask and the first portion of the dielectric at substantially equal rates for a predetermined time thereby eroding sidewalls of the mask during the etching for exposing an increased amount of the dielectric surface to the etching; and removing any remaining portions of the mask.

8. The method of claim 7 wherein isotropically etching the mask and the first portion of the dielectric at substantially equal rates includes isotropically etching by using a downstream plasma etching technique with a plasma having fluorine ions and oxygen ions.

9. The method of claim 7 wherein the applying the erodible mask step includes applying the erodible mask having a thickness at least equal to a difference in a thickness between the elevations and the depressions, and includes the dielectric having a thickness at least equal to the difference in thickness between the elevations and the depressions.

10. The method of claim 7 further including applying a protective layer onto the dielectric after completing the removing any remaining portions of the mask step.

11. A method of reducing irregularities in a surface of a semiconductor device comprising:

applying onto the surface an erodible mask having a reverse image of ht surface, the mask having openings which exposes sidewalls of he mask;

etching the mask and the surface isotropically at approximately equal rates for a predetermined time wherein the sidewalls of the mask are eroded during the etching for exposing additional portions of the surface; and removing remaining portions of the mask.

12. The method of claim 11 wherein etching the mask includes etching the mask isotropically by using a downstream plasma etching technique using fluorine ions and oxygen ions.

* * * * *

UNITED STATES PATENT AND TRADEMARK OFFICE
CERTIFICATE OF CORRECTION

PATENT NO. : 5,139,608

DATED : August 18, 1992

INVENTOR(S) : Gordon M. Grivna

It is certified that error appears in the above-identified patent and that said Letters Patent is hereby corrected as shown below:

Column 6, claim 11, line 7, change "ht" to --the--.

Column 6, claim 11, line 8, change "he" to --the--.

Signed and Sealed this

Eighteenth Day of April, 1995

*Attest:*

BRUCE LEHMAN

*Attesting Officer*  *Commissioner of Patents and Trademarks*